US010687478B2

(12) United States Patent
Rouse et al.

(10) Patent No.: US 10,687,478 B2
(45) Date of Patent: Jun. 23, 2020

(54) OPTIMIZED LED LIGHTING ARRAY FOR HORTICULTURAL APPLICATIONS

(71) Applicants: Austin Rouse, Wellington, FL (US); Anne-Marie Rouse, Wellington, FL (US)

(72) Inventors: Austin Rouse, Wellington, FL (US); Anne-Marie Rouse, Wellington, FL (US)

(*) Notice: Subject to any disclaimer, the term of this patent is extended or adjusted under 35 U.S.C. 154(b) by 0 days.

(21) Appl. No.: 16/578,908

(22) Filed: Sep. 23, 2019

(65) Prior Publication Data

US 2020/0093070 A1    Mar. 26, 2020

Related U.S. Application Data

(60) Provisional application No. 62/734,719, filed on Sep. 21, 2018.

(51) Int. Cl.
| | | |
|---|---|---|
| *A01G 7/04* | (2006.01) | |
| *H01L 25/075* | (2006.01) | |
| *F21V 23/00* | (2015.01) | |
| F21W 131/40 | (2006.01) | |
| F21Y 105/18 | (2016.01) | |
| F21Y 107/40 | (2016.01) | |
| F21Y 115/10 | (2016.01) | |

(52) U.S. Cl.
CPC ............ *A01G 7/045* (2013.01); *F21V 23/003* (2013.01); *H01L 25/0753* (2013.01); *F21W 2131/40* (2013.01); *F21Y 2105/18* (2016.08); *F21Y 2107/40* (2016.08); *F21Y 2115/10* (2016.08)

(58) Field of Classification Search
CPC .............. F21Y 2115/10; F21Y 2105/00; F21Y 2105/10; F21Y 2105/12; F21Y 2105/14; F21Y 2105/16; F21Y 2105/18; A01G 7/045

See application file for complete search history.

(56) References Cited

U.S. PATENT DOCUMENTS

| | | |
|---|---|---|
| 6,609,799 B1 | 8/2003 | Myers |
| 6,921,182 B2 | 7/2005 | Anderson, Jr. et al. |
| 6,969,189 B2 | 11/2005 | Lee et al. |
| 7,030,893 B2 | 4/2006 | Yang |
| 7,071,493 B2 | 7/2006 | Owen et al. |
| 7,217,004 B2 | 5/2007 | Park et al. |
| 7,946,727 B2 | 5/2011 | Lee |
| 8,044,570 B2 * | 10/2011 | Oyaizu ............... F21V 31/04 313/501 |
| D652,160 S | 1/2012 | Brown |
| 8,129,731 B2 | 3/2012 | Vissenberg et al. |

(Continued)

*Primary Examiner* — Robert J May
(74) *Attorney, Agent, or Firm* — The Concept Law Group, PA; Scott M. Garrett; Scott D. Smiley

(57) ABSTRACT

A lighting array for providing artificial light include a square or rectangular frame on which a plurality of chip on board (COB) units are mounted. Each COB units includes a light emitting diode (LED) element. The COB units are mounted in an arrangement of columns and rows, where there are an odd number of columns defined, and COB units on odd numbered columns do not share rows with COB units positioned on even numbered columns. The arrangement achieves a greater uniformity of light intensity over a given growing area compared to conventional lighting systems, at similar light output levels.

17 Claims, 14 Drawing Sheets

(56) References Cited

U.S. PATENT DOCUMENTS

| | | | |
|---|---|---|---|
| 8,292,448 B2 * | 10/2012 | Kim | F21S 2/005 |
| | | | 362/311.02 |
| 8,523,385 B2 | 9/2013 | Lu et al. | |
| D782,710 S | 3/2017 | Merrow et al. | |
| 10,436,425 B1 * | 10/2019 | Vasylyev | F21V 19/003 |
| 2008/0170396 A1 | 7/2008 | Yuan et al. | |
| 2010/0225639 A1 | 9/2010 | Kubis et al. | |
| 2011/0050735 A1 | 3/2011 | Bae et al. | |
| 2011/0175548 A1 * | 7/2011 | Nishimura | H05K 1/0216 |
| | | | 315/294 |
| 2011/0317417 A1 | 12/2011 | Gourlay | |
| 2016/0100528 A1 * | 4/2016 | Chow | A01G 7/045 |
| | | | 362/122 |
| 2017/0265262 A1 * | 9/2017 | Fiermuga | F21V 19/005 |

\* cited by examiner

OPTIMIZED LED LIGHTING ARRAY FOR HORTICULTURAL APPLICATIONS

CROSS-REFERENCE TO RELATED APPLICATION

This application claims priority to U.S. Provisional Patent Application No. 62/734,719 filed Sep. 21, 2018, the entirety of which is incorporated by reference.

FIELD OF THE INVENTION

The present invention relates generally to horticultural lighting systems, and, more particularly, relates to an arrangement of LED lighting elements in an array element to optimize light distribution for consistency in an area under the array element, and to provide spectral customization beyond what is currently available on the market today.

BACKGROUND

Horticultural lighting systems are used to provide artificial light for growing plants within indoor environments. A conventional lighting arrangement includes a single high intensity discharge (HID) high pressure sodium lamp (HPS) which is used to cover five by five squared feet of area. These lamps can be arranged to cover adjacent regions of approximately the same square area. A goal in these lighting systems is to achieve uniform light distribution, and in particular uniform photosynthetically active photon density in the grow area. A single light source produces a photonic density pattern as expected; a high peak photonic density directly under the lamp with a sharp drop off moving outward from that point. This problem increases dramatically with height, moving upward toward the lamp. Some have attempted to solve this secondary problem with moveable lamps that can be raised as the plants grow, which increases the complexity of the lighting system.

To address the photonic density variation issue, the conventional approach has been to add light elements to fill the area over the grow area with light elements. This approach has been enabled by light emitting diode (LED) technology, which allows small light emitting elements to be arranged in a matrix in a panel format over the growing area. However, while filling the overhead area with light emitting elements has produced some improvement in light uniformity in the grow area under the light panel, testing shows that these arrangements still result in a non-uniform photon distribution, with the center of the footprint (squared area) receiving the highest photonic density, which decreases in density with increasing distance from the center, under the light source.

As a result, with both single point light source fixtures, and panel fixtures, plants along the perimeter of the footprint receive less light, and growth is not uniform. Furthermore, the heat generated by these lamps can damage plants, and adjusting the height to a level that ensures damage will not occur exacerbates the non-uniformity of the light. Also, with single bulb systems where there is only one bulb with HID/HPS, spectral customization is limited to the kelvin temperature and color rendering index of that single bulb. Many have attempted to remedy this problem by using lower intensity LEDs, spread across smaller fixtures, in a matrix. All of which still result in a substantial lack of uniformity of photonic density across the growing area under the light fixture.

Therefore, a need exists to overcome the problems with the prior art as discussed above.

SUMMARY OF THE INVENTIVE EMBODIMENTS

In accordance with some embodiments of the inventive disclosure, there is provided a lighting array for horticultural usage that includes a rectangular frame having four corners, and a plurality of chip on board (COB) light emitting diode (LED) units mounted in the frame, including one COB unit in each of the four corners which define outside columns and outside rows with respect to the frame. The plurality of COB units are arranged into an odd number of columns, where alternating column between the outside columns arrange COB units in rows that are staggered between rows defined by the COB units in the outside columns. The lighting array further includes a plurality of LED strips disposed in the outside columns and the outside rows, between the COB units disposed in the outside columns and the outside rows.

In accordance with another feature, the COB units between the outside columns define a hexagon.

In accordance with another feature, there is further provided at least one driver configured to provide regulated electric power to the plurality of COB units and the plurality of LED strips.

In accordance with another feature, the frame is comprised of metal rail members.

In accordance with another feature, the plurality of COB units and the plurality of LED strips produce a peak to minimum photosynthetically active radiation (PAR) measurement of less than 400 with a peak PAR value of at least 700, over a four foot by four foot test area directly under the horticultural lighting array.

In accordance with another feature, the COB units and the plurality of LED strips are configured to output a controllable light output level.

In accordance with some embodiments of the inventive disclosure, there is provided a horticultural lighting array for producing substantially uniform photonic density that includes a plurality of rails arranged as a rectangular frame having four corners and defining a first side and a second side opposite the first side. The lighting array further includes a plurality of transverse rails arranged across the rectangular frame from the first side to the second side and parallel to each other and perpendicular to the first side and the second side. The lighting array further includes a plurality of COB units disposed on the transverse rails, wherein the plurality of COB units include four corner COB units, with one corner COB unit in each of the four corners of the rectangular frame. The four corner COB units define two columns on opposing sides of the frame, and define rows across the frame perpendicular to the two columns. The lighting array also includes at least one additional COB unit located in a column between the two columns on opposing sides of the frame and located on a row between the rows defined by the four corner COB units.

In accordance with another feature, there is further provided at least one LED strip on each of four sides of the rectangular frame at the periphery of the frame.

In accordance with another feature, the at least one additional COB unit comprises a plurality of additional COB units, and wherein the plurality of additional COB units are arranged on the rectangular frame in a way that defines an odd number of columns, and further define at least three rows perpendicular to the odd number of columns and defining odd numbered columns and even numbered columns, and wherein the plurality of additional COB units are arranged such that COB units on the odd numbered columns do not share rows with COB units on the even numbered columns.

In accordance with another feature, the plurality of COB units are arranged such that the photosynthetically active radiation (PAR) as measured on standardized PAR map at a standardized distance from the horticulture lighting array achieves a variance of less than 150 and produces a standard deviation of less than 200.

In accordance with another feature, there is further provided at least one driver coupled to the plurality of COB units that provides an electric current output to the plurality of COB units, and a controller that provides a control signal to the driver. The driver provides the electric current output at a level corresponding to the control signal. A dimmer is coupled to a controller that provides an input to the controller, and wherein the controller varies the control signal to the driver in correspondence with the input provided by the dimmer.

In accordance with another feature, at least some of the plurality of COB units are arranged in the shape of a hexagon.

In accordance with another feature, the plurality of rails are formed of square tubular metal sections.

In accordance with another feature, the plurality of COB units and the plurality of LED strips produce a peak to minimum photosynthetically active radiation (PAR) measurement of less than 400 with a peak PAR value of at least 700, over a four foot by four foot test area directly under the horticultural lighting array.

In accordance with another feature, the rectangular frame is a square frame having sides measuring substantially forty two inches, and wherein the plurality of COB units is thirteen COB units.

In accordance with another feature, the rectangular frame is a square frame having sides measuring substantially twenty four inches, and wherein the plurality of COB units is five COB units.

In accordance with another feature, the rectangular frame is a square frame having sides measuring substantially thirty six inches, and wherein the plurality of COB units is ten or eleven COB units.

Although the invention is illustrated and described herein as embodied in a horticultural lighting array, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

"In the description of the embodiments of the present invention, unless otherwise specified, azimuth or positional relationships indicated by terms such as "up", "down", "left", "right", "inside", "outside", "front", "back", "head", "tail" and so on, are azimuth or positional relationships based on the drawings, which are only to facilitate description of the embodiments of the present invention and simplify the description, but not to indicate or imply that the devices or components must have a specific azimuth, or be constructed or operated in the specific azimuth, which thus cannot be understood as a limitation to the embodiments of the present invention. Furthermore, terms such as "first", "second", "third" and so on are only used for descriptive purposes, and cannot be construed as indicating or implying relative importance.

In the description of the embodiments of the present invention, it should be noted that, unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the term "longitudinal" should be understood to mean in a direction corresponding to an elongated direction of the array frame. Those skilled in the art can understand the specific meanings of the above-mentioned terms in the embodiments of the present invention according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

DETAILED DESCRIPTION

Figure 1:
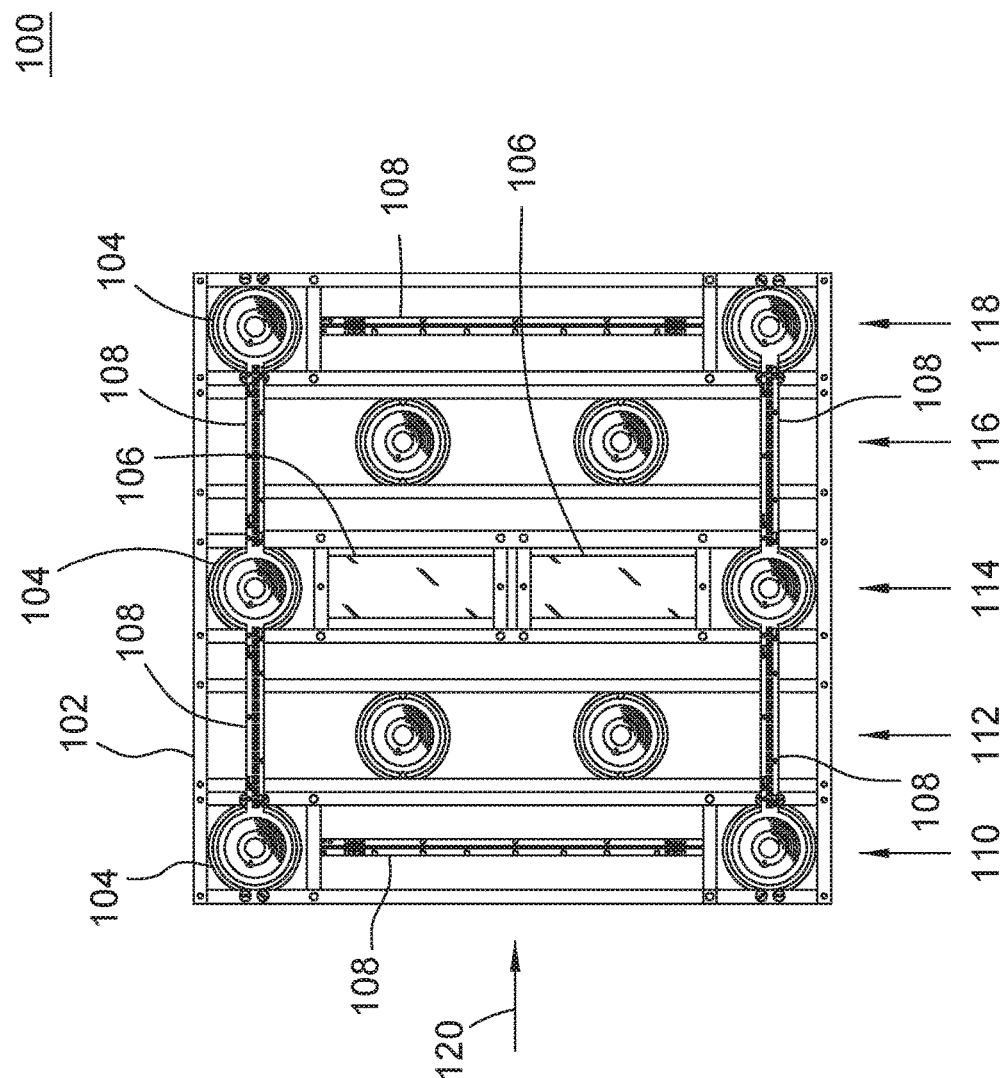
FIG. 1 is a bottom view of a lighting array element, in accordance with some embodiments.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

Conventional LED lighting arrays intending to succeed HID lighting technology and similar pervious lighting technologies generally fall into one of three categories: (1) arrays comprised solely of smaller diodes, such as the LM301B, installed to custom printed circuit boards; (2) arrays comprised solely of straight LED strips arranged in a matrix of uniform rows and columns; and (3) arrays comprised solely of circular COB LEDs arranged in a matrix of uniform rows and columns, with the largest arrays, which are intended to cover a five by five square foot area, including COB units in 3×4 or 4×3 rows, resulting in a total of twelve COB units. These conventional arrangements all provide a higher variation of photonic density across the growing area than the disclosed inventive LED arrangements. A benefit of the uniformity produced by the inventive embodiments is that the uniformity persists through dimming, which allows the lighting array to be held in place long over a growing period, rather than requiring numerous height adjustments of the lighting array. Thus the disclosed inventive embodiments, by achieving greater photonic density uniformity across a grow area, in addition to a greater yield and more consistent growth throughout the grow area, the amount of mechanical adjustment of the lighting needed is substantially reduced and instead, the light output can be dimmed, which is counter-intuitive to the conventional approach to grow lighting.

According to some embodiments of the inventive disclosure, using the novel arrangement of lighting elements with an equidistance between COB units, the arrangement results in a true squared array comprised of thirteen COB units and straight LED strips positioned along the perimeter of the squared array. In comparison with conventional HID lamps and prior art LED arrays, the novel arrangement of the inventive disclosure provides a substantial improvement in photometric uniformity over those earlier systems, as indicated by a variance measurement algorithm developed to calculate variance in photonic density across a grow area. These comparisons show that prior art horticultural lighting systems produce substantially non-uniform photon distribution in comparison, with the center of the footprint (squared area) receiving the highest photonic density, which decreases in density with increasing distance from the center. The novel arrangement and lighting array of the inventive disclosure avoid photonic "hot spots" and achieve greater photonic density uniformity under the array by placing straight LED strips with lower voltage than the COB units along the perimeter of squared arrays, and which are wired in series with the COB units, resulting in lower-powered LED strips relieving the natural centralized intensity found toward the center of the footprint (e.g. a hot spot). With prior art HID systems, such as those comprised of only one bulb, and prior art LED systems having their diodes arranged in a matrix of uniform rows and columns, spectral customization capability is limited, and a lack of uniform photon distribution results. In arrays comprised solely of smaller diodes, such as the LM301B, it has been found that canopy penetration is sacrificed, and the horticulturist must ensure their fixtures maintain a mounting distance very close to the plants in order to maximize the effectiveness of the array, whereas the inventive arrays disclosed herein allow the horticulturist to maintain a fixed mounting distance in the range of 18-22" above their canopy, and the uniform photonic intensity can be controlled with a linear rotary turn-knob potentiometer (the device used to control the 0-10V dimming capability offered by the drivers which power the inventive fixtures). With the majority of light output being sourced from high-powered COB units, optimal canopy penetration is achieved without needing to maintain a mounting distance in close proximity to the canopy. This also results in a more favorable environment for the plants, as there is a greater distance between the radiant temperature produced by the array and the canopy. In comparison with conventional HID lighting systems, due to the improved efficiency in illuminance the inventive arrays provide, and subsequent lesser heat produced, direct power savings upward of 40% can be had.

The present disclosure provides a novel and efficient lighting array element that has been produced through observing and measuring light density from various points to create an optimized lighting arrangement that is contrary to conventional approaches. Conventional horticultural lighting fixtures produce similar photometric uniformity flaws and a basic spectrum. Thus providing the canopy with less than it needs for optimized growth. Embodiments of the invention utilize Chip On Board (COB) LED elements in minimized lighting array arrangements, in combination with secondary perimeter strips of LEDs having a different spectral output; the combination of which offers a substantially improved light distribution uniformity. This is accomplished in part by placing several COB units in hexagonal or staggered configurations with LED strips along the perimeter, on an aluminum frame, as opposed to, for example, a single bulb placed in the center of the light footprint, or a matrix of LED elements or COB units. This innovation enables achievement of a higher Photosynthetic Photon Flux Density (PPFD) score, with 30%-40% less power draw, compared to comparable conventional lighting units, and lower Photosynthetically Active Radiation (PAR) "hot spots" due to the improvements in light uniformity. By avoiding the PAR hotspots, greater power draw, and increased radiant temperature that is associated with prior art systems, the inventive lighting fixtures can be placed closer to the plant canopy, generating greater photonic intensity/saturation, resulting in tighter internode spacing without harming the plants. The plants remain unharmed due to the absence of severe hotspots observed in the testing of alternative lighting fixtures. Further, as the plants grow, light levels received by the plants can be maintained by dimming the lighting, rather than raising the light fixture, because of the increase in light uniformity across the grow area. That is, relative to the conventional HID type lamps, with the inventive fixture arrangements, it is possible to dim the intensity of the light output to a desirable level, without needing to adjust the mounting distance of the fixture. This can be accomplished by fine-tuning the intensity of the light by observing an LCD display with the potentiometer's sensor values being mapped into 0-100% format, which is integrated with the potentiometers wired to the presented fixtures. This is a very important feature for horticulturists which they are not accustomed to having. Traditional HID systems have recently been improved with digital ballasts which allow dimming in 25% increments (i.e. a 50% setting, % 75 setting). However, this non-linear dimming capability is discouraged amongst the indoor horticulture community because it has been found that dimming HID bulbs in this fashion exacerbates the fundamental issues regarding HID bulb degradation. Even without utilizing the dimming feature, it is recommended that HID bulbs be replaced roughly every other grow cycle, due to their rapid photonic production degradation. For reference: LED diodes can be expected to endure upwards of 8,000 hours of operation before photonic degradation even begins.

Utilizing this HID dimming feature in prior art systems degrades the bulb faster than if it were to run the bulb at full power. Therefore, the general consensus in the indoor horticulture industry is that one should not dim HID bulbs, but rather raise and lower the mounting distance in response to various characteristics exhibited by the plants being grown, as observed by an experienced horticulturist. It has been found by the inventors through running the disclosed arrays through testing that altering the mounting distance by as little as 2" has a substantial effect on the photometric uniformity produced by a lighting array. As such, growing in the style required by HID systems creates a very tricky craft to master. Simply put, the inventive fixtures allow for a much easier and sensible growing experience.

Referring now to FIG. 1, there is shown a bottom view of a lighting array element 100, in accordance with some embodiments. The lighting array element 100 is comprised of a frame 102 that is made up of length of metal beams or rails, and can be about 36"×36". In some embodiments the frame can be comprised of aluminum rail segments joined together in a rectangle/square configuration. There are four such segments that define a perimeter of the frame, and various segments that generally define a plurality of columns, as shown here extended from the perimeter segment at the top of the drawing to the opposing parallel perimeter segment at the bottom of the drawing, here defining several columns labeled 110, 112, 114, 116, 118, with each column defined by two parallel rail segments. Shorter cross member rail segment can be used to provide additional mounting locations between the column rail segments. The lighting array element 100 includes ten COB units, or could have an additional COB unit at the center of the array 100 for a total of eleven COB units.

A plurality of chip on board (COB) light emitting diode (LED) units, or simply COB/COB units, are mounted in the frame 102. Each COB unit includes an LED element, a housing, a heatsink, and circuit board and associated circuitry for operating the LED element. In some embodiments the COB units are lensless, lacking a focusing or diffusing lens. The LED element can be one or more "chips" or other LED units that include a LED. As shown here, the several COB units in the top row are designated with the reference numeral "104," which will be used hereafter to refer to all COB units including those not specifically referenced with a reference numeral. Each COB 104 can comprise multiple LED chips packaged together and bonded to a substrate as one lighting module, or a single larger LED element, and the area in which the LED chips are packaged appear as a single lighting source, rather than individual light sources, when illuminated.

The plurality of COB units 104 are arranged in the columns 110-118, and in rows. However, while the outside columns (e.g. 110, 118) include COB units 104 at the corners of the frame 102, which define rows (e.g. horizontal in the drawing), the alternating or even numbered columns (e.g. 112, 116) position COB units at locations in different rows, and not on the same row as the outside columns 110, 118. In some embodiments there are defined a plurality of columns where the total number of columns is an odd number (e.g. 3, 5). In the odd numbered columns (e.g. 1st being column 110, 3rd being column 114, and 5th being column 118) COB units are positioned in rows along the opposing ends of the columns. COB units in the even numbered columns (e.g. $2^{nd}$ being column 112, and $4^{th}$ being column 116) the COB units are not positioned on the same rows as those of the odd columns 110, 114, 118. Thus, the positions of the COB units are staggered, row-wise, on alternating columns, with the outside columns always having COB units at the corners of the frame 102, and forming a row along each end of the columns. It will be appreciated by those skilled in the art that the application of the terms "column" or "columns" and "row" or "rows" are based on the arbitrary orientation of the frame 102 as shown in FIG. 1. If the frame were rotated 90 degrees, then the "columns" would be oriented in the direction of rows, as commonly used when referring to orientation on a page, such as the page on which the drawing appears.

In general, the inventive lighting arrays are square/rectangular, have a COB located at each corner of the array. Further, adjacent corners (as opposed to the opposing corners diagonally across the array) define columns and rows. The columns are further defined by rail segments from one side of the perimeter of the array to an opposing side of the perimeter of the array, at right angles to those array perimeters. There are an odd number of columns, with rows of COB units being staggered on the rows across the columns such that there are no COB units in the even numbered columns that share a row with COB units in the odd numbered columns. Thus, the array arrangement can be expanded or reduced from a minimum of three columns up to, theoretically, any odd number of columns, so long as the arrangement principles disclosed herein are followed, in order the achieve the substantial improvement in light uniformity under the array.

Along, or on the perimeter sides, between COB units 104, there can be LED strips 108, each strip comprising a plurality of LEDs. The LEDs in the LED strips 108 are arranged in a series along a line, and are not packed in the same close proximity to each other as are the chips in the COB units 104. Furthermore, the LEDs of the LED strips can be configured to output light having a different spectral profile than that of the COB units 104. Thus, the LED strips 108 help fill in the light under the array element 100 in density as well as in spectra. This is not to say the different COB units couldn't have a different spectral output within the presented configurations as well. The LED strips 108 can be positioned in a line between the centers of the corner-located COB units as shown, or they can be farther to the side, on or immediately adjacent to the perimeter rails.

The COB units 104 and LED strips 108 are driven by regulated electric power provided by drivers 106. The drivers 106 are power supplies having a regulated electric output, and can themselves be powered by a commercial AC input (e.g. 120 VAC). The drivers 106 provide the necessary current and voltage required to drive the COB units 104 and LED strips 108, which may have different voltage/current requirements. Wiring from the drivers 106 to the COB units 104 and LED strips 108 can be routed along, or inside the rail segments comprising the frame 102. The output of the drivers 106 can be adjustable responsive to an input control signal, such as a 0-10 VDC control signal, to provide dimming functionality. In some embodiments the LED strips can be coupled in series with the COB units, and have a lower operating voltage than the COB units, and use less power. In some embodiments each LED strip 108 can operate at about 11.1 volts, while each COB unit operates at about 50.5 volts. Both the LED strips 108 and COB units can be driven by the same driver at a current of about 1 ampere.

The LED strips 108, which output a lower intensity light than that of the COB units, serve to relieve the centralized intensity that would naturally result. Essentially, the LED strips 108 provide a highly efficient light source along the perimeter of the array, increasing photonic intensity under the perimeter relative to the center. Arrays have been tested using the COB units arranged as disclosed, both with and without perimeter-mounted LED strips. The perimeter-mounted LED strips have been found to result in a significant improvement in the uniformity of the perimeter, under the array, of the tested area. In some of the disclosed array configurations, the LED strips also serve to offer the ability to have different spectral outputs at each LED strip. Accordingly, the LED strips also allow customization of the spectral profile of the light produced by the array.

Figure 2:
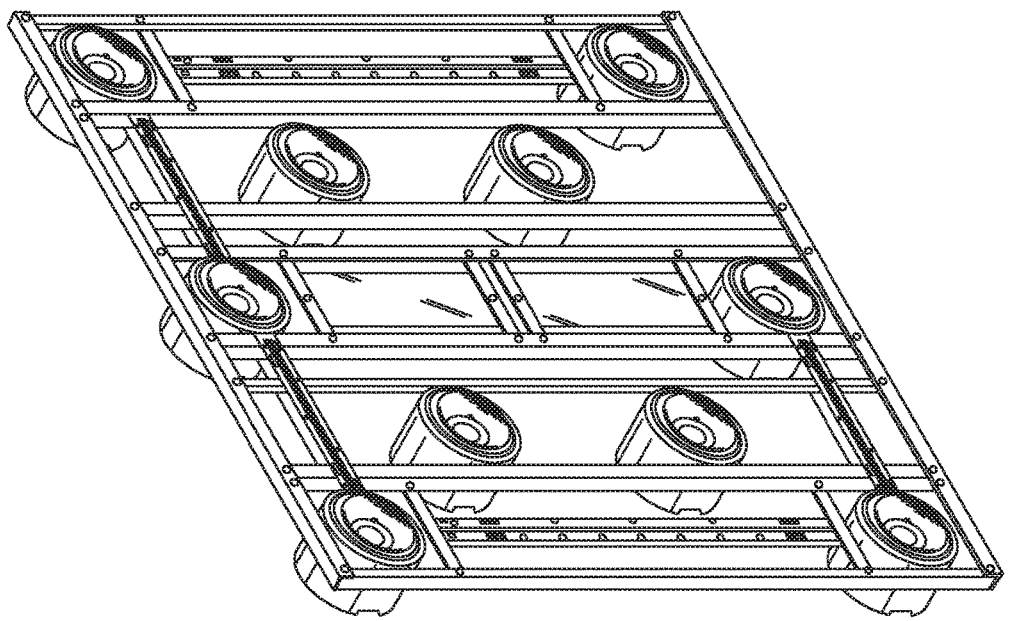
FIG. 2 is a perspective view of a lighting array element, in accordance with some embodiments.

FIG. 2 is a perspective view of a lighting array element 100, in accordance with some embodiments. That is, the view shown here is of the same array element 100 as shown in FIG. 1, turned for a perspective view with the same components and construction as shown in FIG. 1. The COB units 104 each include a heatsink that extends upward in order to facilitate cooling and heat dispersion from the LED element of the COB.

Figure 3:
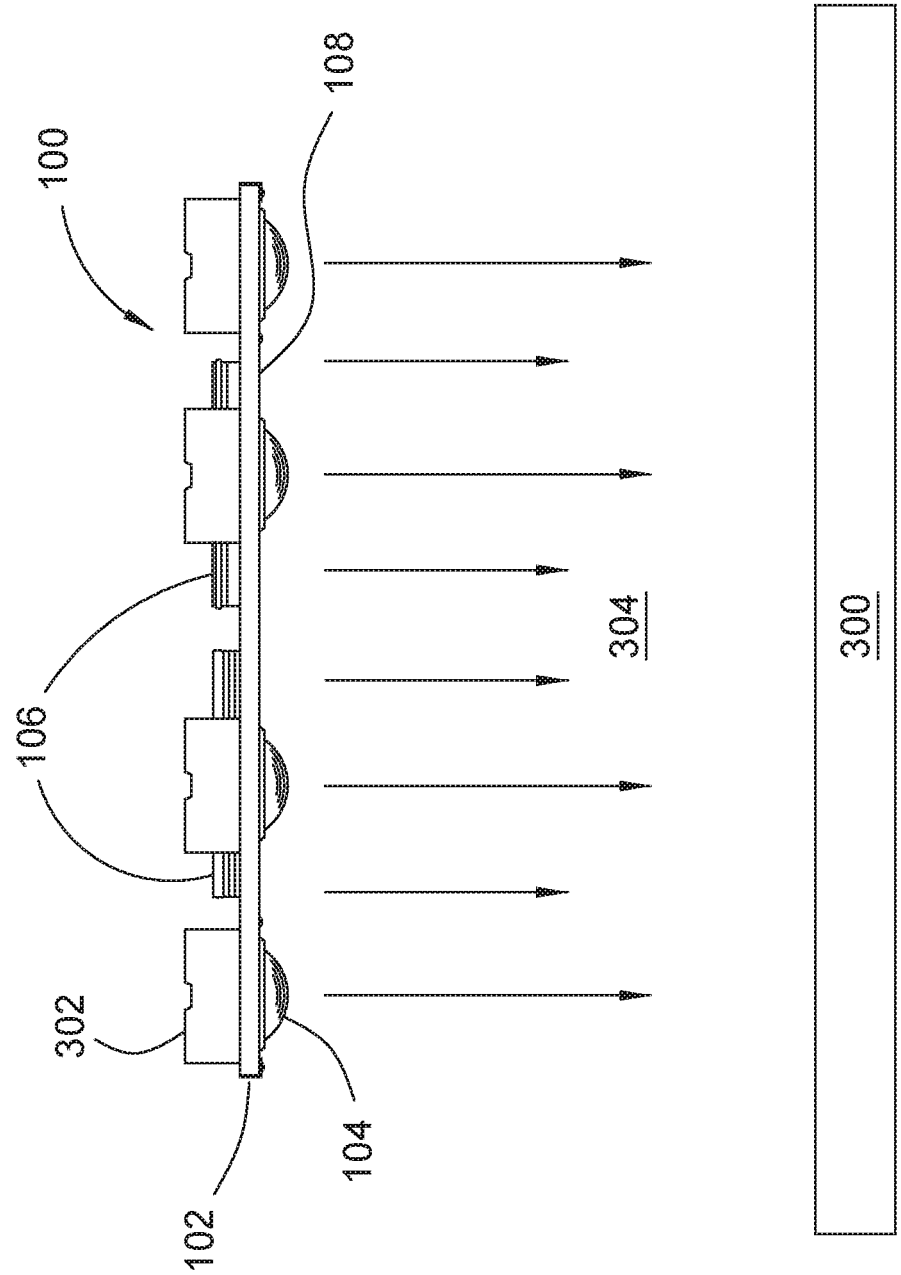
FIG. 3 is a side view of a lighting array element, shown positioned over a grow area, in accordance with some embodiments.

FIG. 3 is a side view of a lighting array element 100, shown positioned over a grow area 300, in accordance with some embodiments. The view here is taken from the side of the array element 100, in the direction of arrow 120 in FIG. 1. Each COB 104 comprises a heatsink 302 that extends above the frame 102. Light 304 from the COB units 104 and the LED strips is directed downward to the grow area 300. Light from the COB units 104 is represented by the longer, heavy lines directly under each COB 104 in view, and light from the LED strips is represented by the thinner, shorter arrows between those for the COB units 104.

Figure 4:
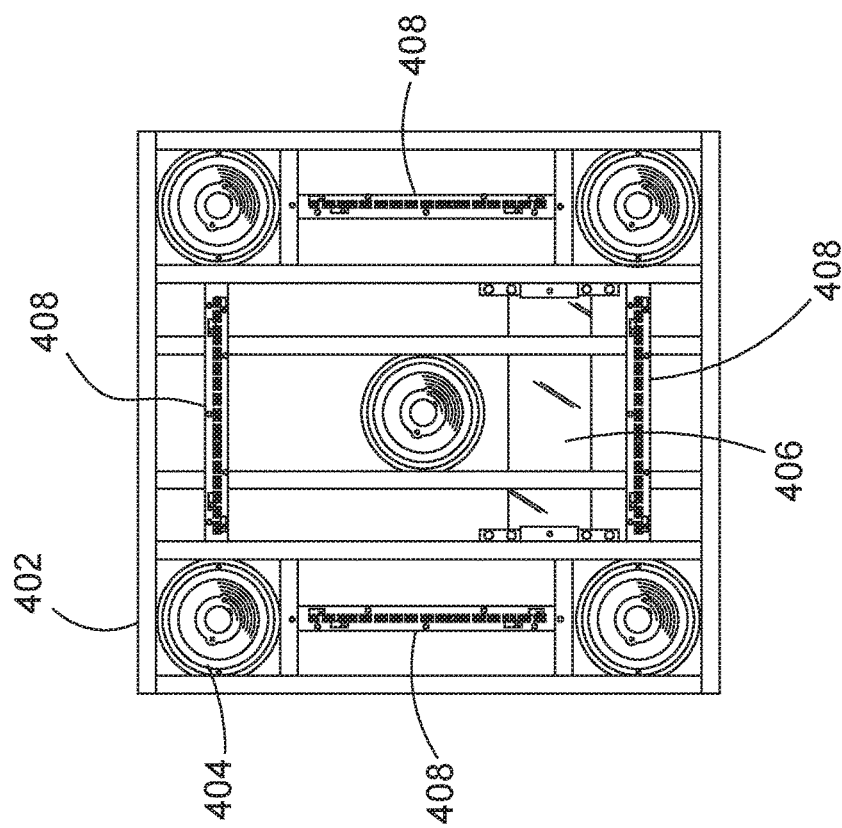
FIG. 4 is a bottom view of an alternative lighting array element, in accordance with some embodiments.

FIG. 4 is a bottom view of an alternative lighting array element 400, in accordance with some embodiments. Array element 400, like array element 100, comprises a rectangular frame 402, in which a plurality of COB units 404 are mounted and arranged in an odd number of columns, and can measure about 24"×24". Here, there are only three columns, and a total of five COB units. The outside columns have only two COB units 404, and the sole middle column has one COB 404. The COB units 404 at the outside columns are positioned at the corners of the frame 402, defining rows along the ends of the columns (top and bottom of the drawing, as shown). LED strips 408 are arranged around the perimeter, between the COB units 404 at the corners, and the COB units 404 and LED strips 408 are powered by a driver 406. The array element 400 is smaller in size (width & length) than array element 100; COB units 404 can be the same COB units 104 used in FIG. 1, and likewise for LED strips 408. Thus, array element 400 is for smaller grow areas than that of array element 100.

Figure 5:
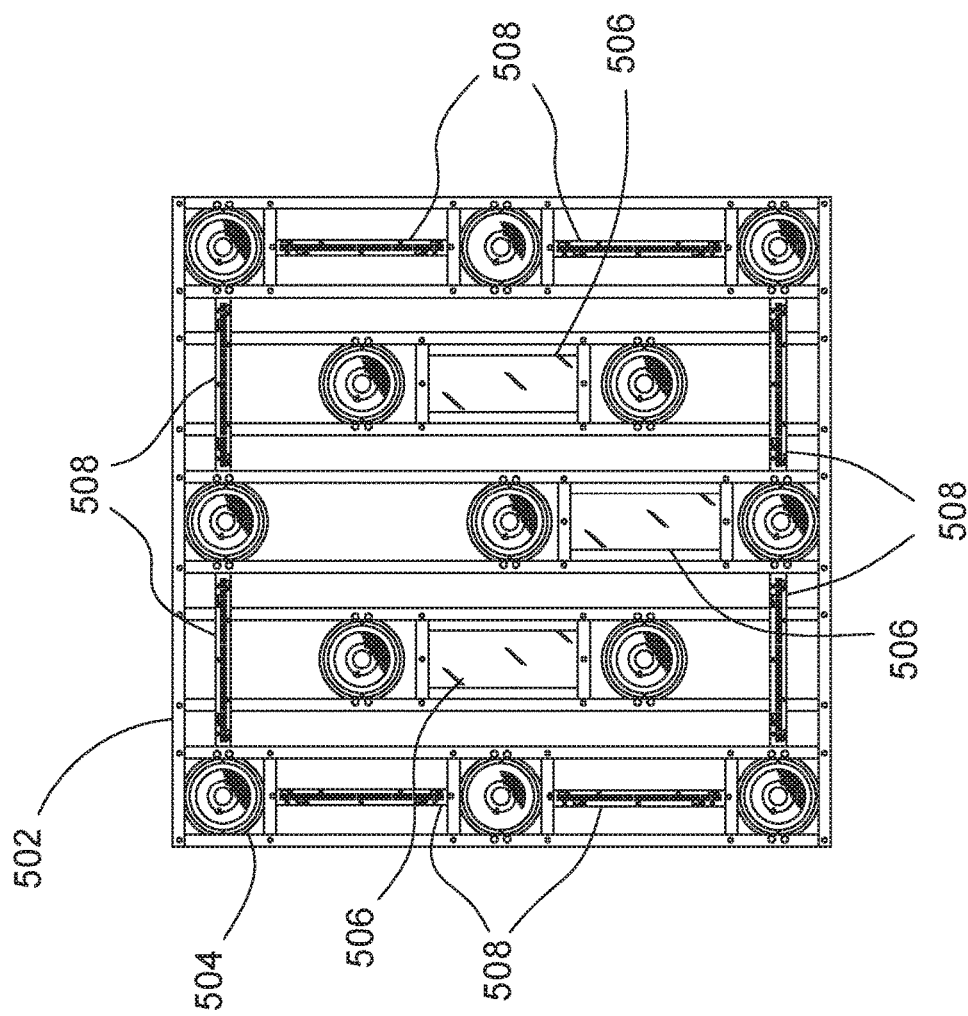
FIG. 5 is a bottom view of an alternative lighting array element, in accordance with some embodiments.

FIG. 5 is a bottom view of an alternative lighting array element 500, in accordance with some embodiments. Array element 500, like array element 100, comprises a rectangular frame 502, in which a plurality of COB units 504 are mounted and arranged in an odd number of columns, and can measure about 42"×42". Here, there are five columns, and a total of thirteen COB units. The outside columns and the middle column have three COB units 504, and the intermediate columns (the even numbered columns) each have two COB units 504. The COB units 504 at the outside columns include COB units 504 positioned at the corners of the frame 502, defining rows along the ends of the columns (top and bottom of the drawing, as shown), and along a middle row, having a COB 504 in the center of the array element 500. LED strips 508 are arranged around the perimeter, between the COB units 504 at the corners and middle of the outside columns and the top and bottom rows, and the COB units 504 and LED strips 508 are powered by drivers 506. The array element 500 is larger in size (width & length) than array element 100; COB units 504 can be the same COB units 104 used in FIG. 1, and likewise for LED strips 508. Thus, array element 500 is for larger grow areas than that of array element 100.

In each of the lighting arrays of FIGS. 1, 4, and 5, the same general arrangement principle is used; a square or rectangular array includes COB units at each of the corners of the array. These corner COB units define columns, and the internal area of the array includes an odd number of columns (thereby making the total number of columns also odd numbered). The corner-located COB units also define the top and bottom rows. There is at least one additional row, running perpendicular to the columns, and there can be either an odd or an even number of rows, depending on the configuration. However, the COB units for a given row are located exclusively on either the odd numbered columns or the even numbered columns. This arrangement was arrived at by testing, and is counter to the conventional approach of simply adding light elements to "fill in" gaps. COB units located in odd numbered columns do not share rows with COB units on even numbered columns. Further, there are always an odd number of columns.

Figure 6:
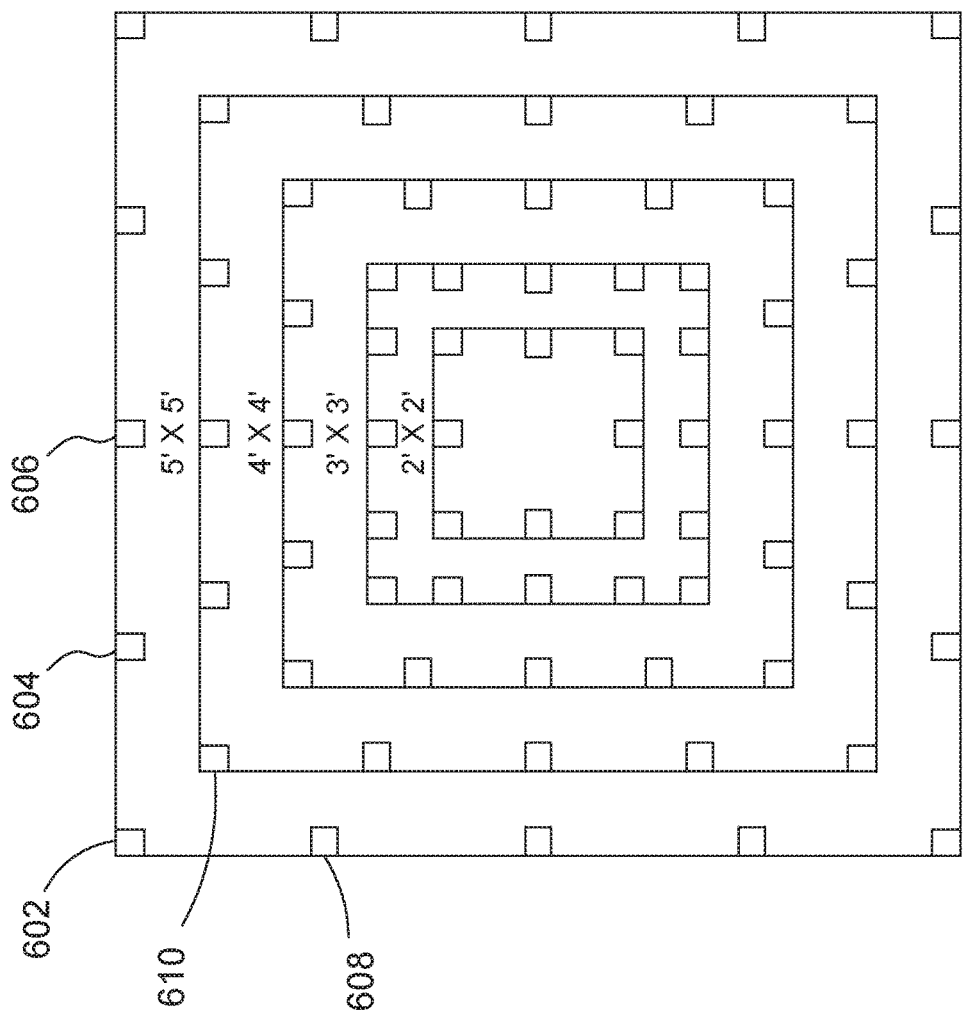
FIG. 6 shows a photometric uniformity testing map used in testing the light uniformity of various grow light fixtures.

FIG. 6 shows a photometric uniformity testing map 600 used in testing the light uniformity of various grow light fixtures. The map 600 is comprised of a several nested and centered squares. The largest, or outside square, is five feet by five feet square. Nested within that outside square is a four foot by four foot square, then a three foot by three foot square, and a two foot by two foot square. Each of the squares comprises a plurality of test points at which light is measured in terms of photonic density. A graph chart can be created by plotting the photonic density at the points around each square, and advancing inward to the next square. For example, the first chart point can be the photonic density measured at point 602, followed by the photonic density measured at point 604, then at point 606, and so on, around the five foot by five foot square to point 608, whereupon the next charted point is point 610 on the four foot by four foot square, and the series continues around the four foot by four foot square, measuring photonic density at each of the points indicated by the smaller squares.

Figure 7:
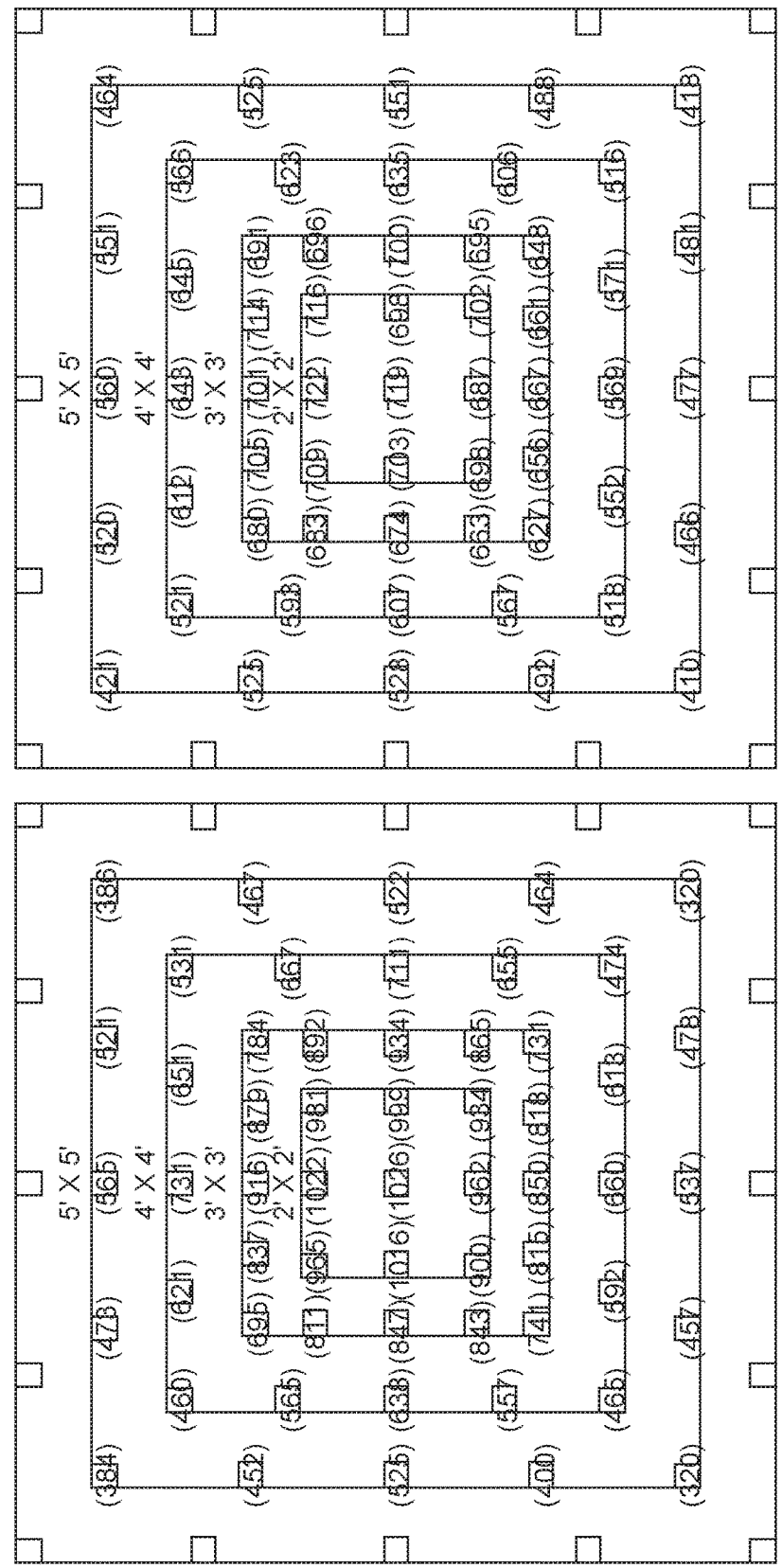
FIG. 7 shows a comparison of a PAR map for a prior art lighting element and a PAR map for a lighting fixture designed in accordance with the disclosed inventive principles.

FIG. 7 shows a comparison of a PAR map for a prior art lighting element and a PAR map for a lighting fixture designed in accordance with the disclosed inventive principles. Specifically, PAR map 700 is a test result of a HLG-550 V2 light fixture, manufactured by the Horticulture Lighting Group Corp., which is designed to replace a 1000 Watt high intensity discharge single ended bulb lighting fixture, and the measured area is a four foot by four foot area. The numbers shown on the various test points are the measured values in micro-moles per second-meter squared (s-m$^2$) as actually measured at the corresponding point. The light being measured is photosynthetically active radiation (PAR). The testing was conducted with a commercially available quantum photometer. PAR map 702 is a test result of the output of a four foot by four foot array designed according to the inventive principles disclosed herein, such as that shown in FIG. 1. Both of the units had a matched power draw, meaning their input power was substantially the same among them. The testing was conducted at a standard distance of 22" for both systems.

Figure 8:
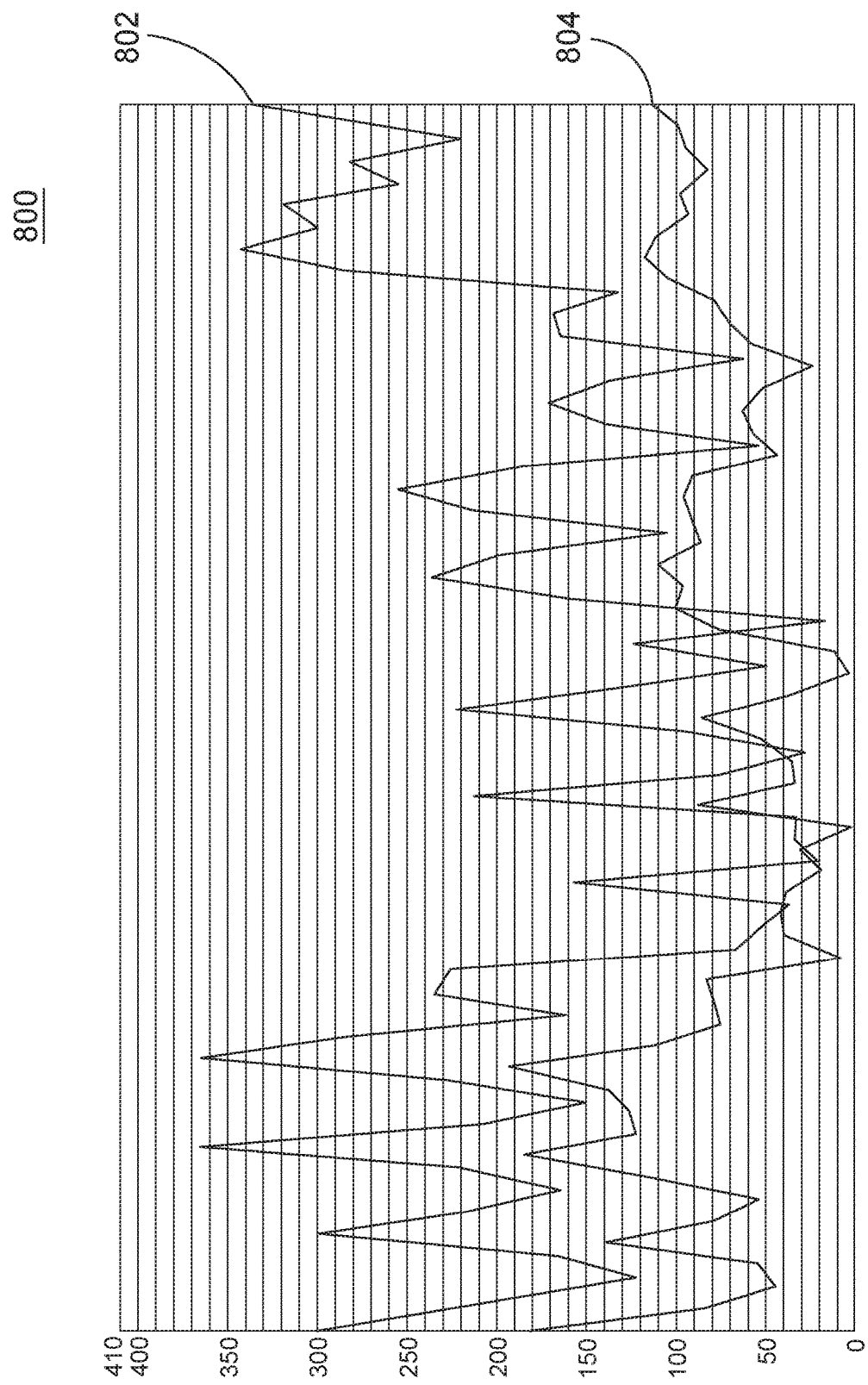
FIG. 8 is a graph plot of the deducted variance of the measured values for the measured points of both PAR maps of FIG. 7.

FIG. 8 is a graph plot 800 of the deducted variance of the measured values for the measured points of both PAR maps of FIG. 7. The first line 802 represents the deducted variance among the measured values of PAR map 700, and the second line 804 represents the deducted variance among the measured values of PAR map 702. The first plot point for each line, 802, 804 (the farthest left) corresponds to the upper left point of the four foot by four foot square. The next plot point in each line 802, 804 corresponds to the next point (e.g. to the right of the first point) and the subsequent points follow the outside of the four foot by four foot square, and then the three foot by three foot square, and so on, spiraling inward to the center point of the two foot by two foot square, for a total of fifty seven plotted points. To calculate the deducted variance at each point, the average of all of the PAR measurements is determined, and the measured PAR value at each point is subtracted from the PAR average, and the absolute value of that result is taken to produce a deducted PAR variance value for each given point. The deducted PAR variance values are plotted in line 802, 804. The average PAR spike value (APSv) is the average of deducted PAR variance values. Using this methodology, the APSv for PAR map 700 is 177.8, and the APSv for PAR map 702 is 79.1, while the total of the PAR measurements for map 700 is 38,925 and for PAR map 702 is 34,436. Using a more familiar statistical analysis, the standard deviation for PAR map 700 is 202.7, and the standard deviation for PAR map 702 is 90.0. Thus, a substantial reduction in variance across the surface under the lighting fixtures is achieved using the lighting array design of FIG. 11, while producing a similar total light output over the measured area compared to the LED matrix panels of a conventional LED panel such as the HLG-550 V2 panel. Further, the center "hot spot" is avoided by using the inventive array design (e.g. value of "1026" in PAR map 700 versus a center value of "719" in PAR map 702).

Figure 9:
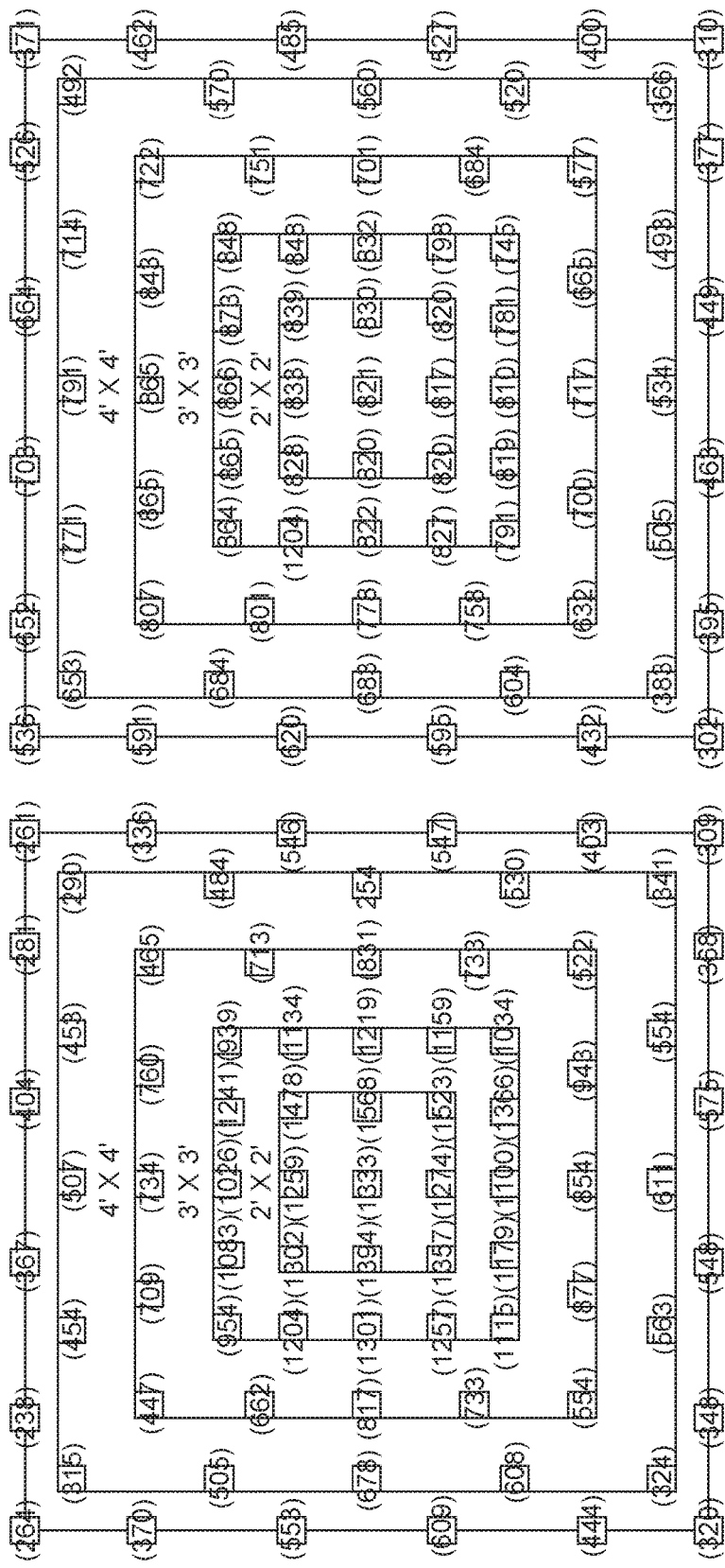
FIG. 9 shows a comparison of a PAR map for a prior art lighting element and a lighting fixture designed in accordance with the disclosed inventive principles.

FIG. 9 shows a comparison of a PAR map for a prior art lighting element and a lighting fixture designed in accordance with the disclosed inventive principles. Specifically, PAR map 900 is a test result of a high pressure sodium lighting element at 1000 Watts, and the measured area is a 4.5'×4.5' area. The numbers shown on the various test points are not reference numerals, but are measurements of PAR in micro-moles per second-meter squared as actually measured at the corresponding point, with the respective light fixtures set up at a standardized distance, which is the same for each PAR map 900, 902. The light being measured is photosynthetically active radiation. The testing was conducted with a commercially available quantum photometer, and specifically a MQ-500 from Apogee Instruments. PAR map 902 is a test result of the output of a 42"×42" array as depicted in FIG. 11 and designed according to the inventive principles disclosed herein, and having a 842 Watt power draw.

Figure 10:
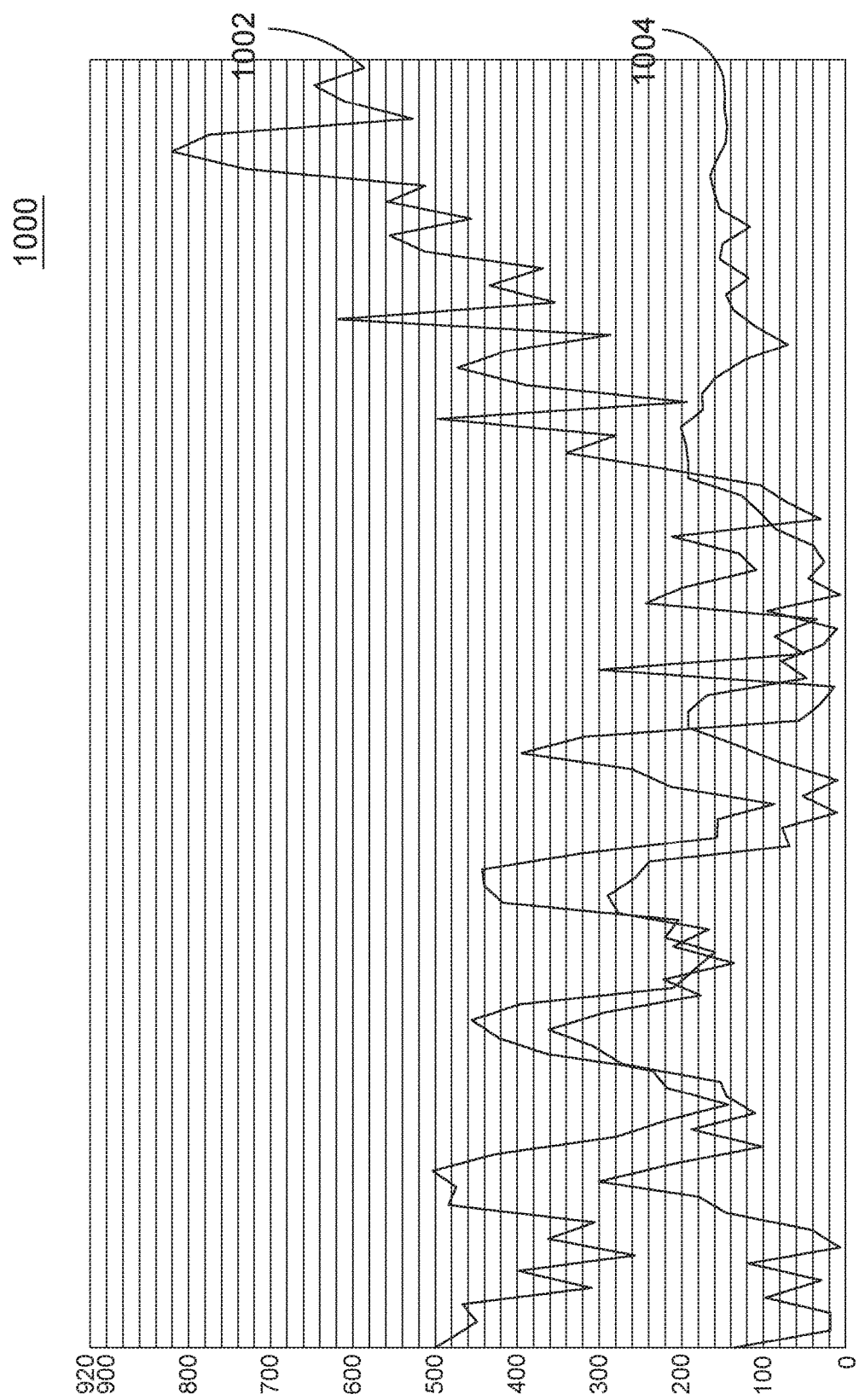
FIG. 10 is a graph plot 1000 of the deducted variance of the measured values for the measured points of both PAR maps of FIG. 9.

FIG. 10 is a graph plot 1000 of the deducted variance of the measured values for the measured points of both PAR maps of FIG. 9. The first line 1002 represents the deducted variance among the measured values of PAR map 900, and the second line 1004 represents the deducted variance among the measured values of PAR map 902. The first plot point for each line, 1002, 1004 (the farthest left) corresponds to the upper left point of the four foot by four foot square. The next plot point in each line 1002, 1004 corresponds to the next point (e.g. to the right of the first point) and the subsequent points follow the outside of the four foot by four foot square, and then the three foot by three foot square, and so on, spiraling inward to the center point of the two foot by two foot square, for a total of fifty seven plotted points. To calculate the variance at each point, the average of all of the measurements is determined, and the measured PAR value at each point is subtracted from the PAR average, and the absolute value of that result is taken to produce a deducted PAR variance value. The deducted PAR variance values are plotted in line 1002, 1004. The total variance is then taken as the average of deducted PAR variance values. Using this methodology, the APSv for PAR map 900 is 323.9, as charted on plot 1002, and the APSv for PAR map 902 is 139.3, as charted on plot 1004, while the total of the PAR measurements for map 902 is 51,770 micromoles/s-m$^2$, and for PAR map 900 is 58,146 micromoles/s-m$^2$. The standard deviation of the measurements shown on PAR map 900 is 373, and the standard deviation of the measurements shown on PAR map 902 is 161. Thus, again, a substantial reduction in variance is achieved using the lighting array design of FIG. 5 while producing a similar total light output over the measured area compared to the conventional HID fixture. And again, the center "hot spot" is avoided by using the inventive array design. Similar improvements have been found using the array design of FIG. 4, as well.

Accordingly the inventive lighting arrangement generally achieve a APSv of less than 150 and a standard deviation of less than 200 in PAR, as measured on a standardized PAR map at a standardized distance from the horticulture lighting array. The peak to minimum PAR difference in PAR map 702 is a difference of 309 from the center point to the lower left corner point. For PAR map 700 the peak to minimum is a difference on PAR value of 706, which is more than double that of the difference resulting on PAR map 702, which used a lighting array designed according to the inventive disclosure herein. Similarly, the peak to minimum PAR difference in PAR map 900 is a difference of 1307 (1568–261), whereas the maximum peak to minimum difference in PAR map 902 is 571 (873–302). In both cases (e.g. comparing PAR maps 700, 702 and 900, 902) the overall total light output was substantially similar, as determined by summing all of the measured PAR values at the various standardized test points. Accordingly, the inventive lighting array configuration achieves a substantial increase in uniformity across the growing surface area, and substantially reduces the "hot spot" effect associated with common prior art lighting systems. The inventive lighting arrays are particularly suited to commercial growing operations due to the improvement in photometric uniformity over the prior art systems.

Figure 11:
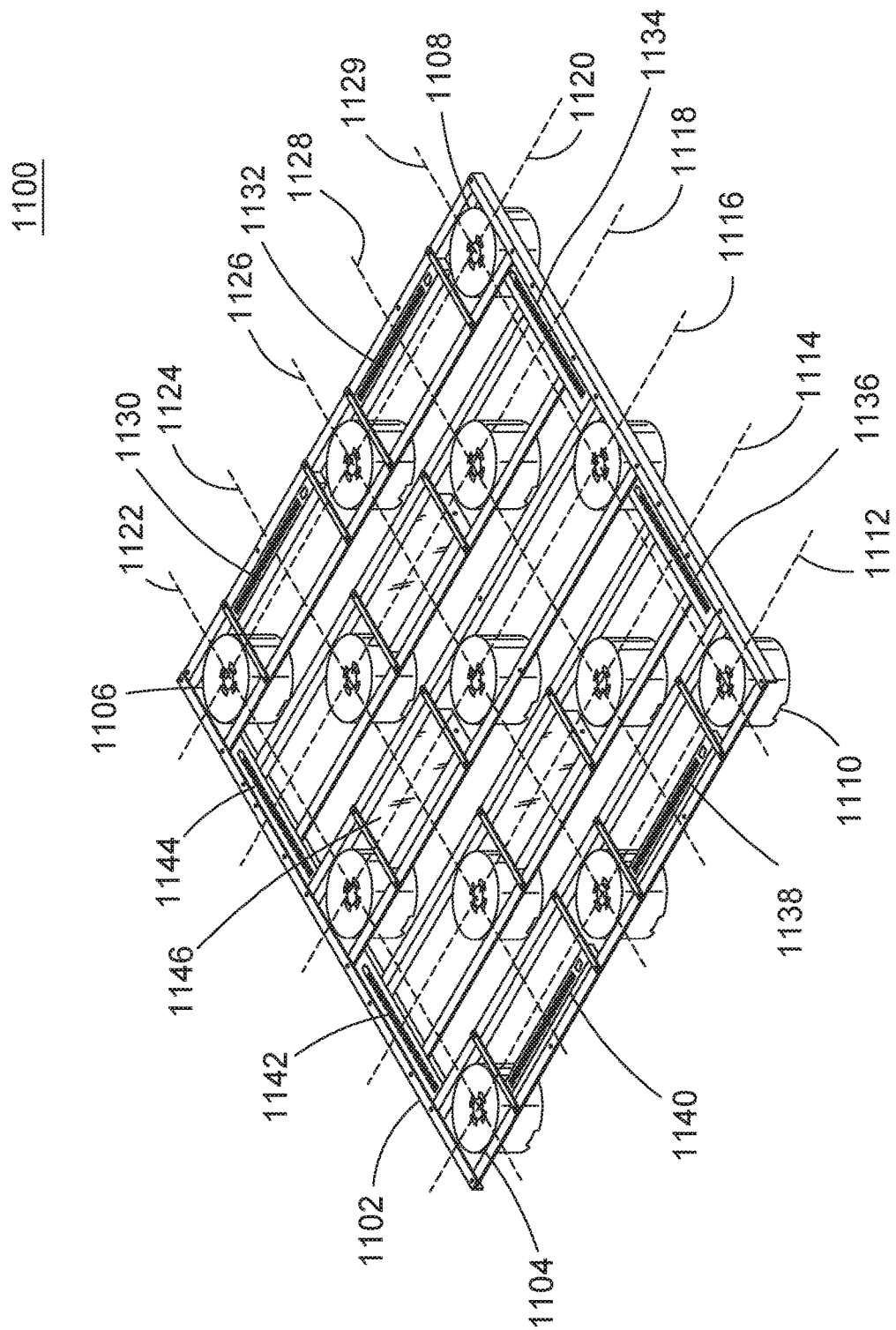
FIG. 11 shows a bottom perspective view of an alternative lighting array 1100, in accordance with some embodiments.

FIG. 11 shows a bottom perspective view of an alternative lighting array 1100, in accordance with some embodiments. The array 1100 is comprised of a square rail assembly 1102 having four sides and four corners. At each corner there is mounted a COB, including COB units 1104, 1106, 1108, 1110. Five columns are defined along dashed lines 1112, 1114, 1116, 1118, and 1120. Five rows are defined along dashed lines 1122, 1124, 1126, 1128, 1129. The rows 1122, 1124, 1126, 1128, 1129 are perpendicular to the columns 1112, 1114, 1116, 1118, and 1120, and both are either parallel or perpendicular to the sides of the array 1110. An odd number (five) of columns 1112, 1114, 1116, 1118, 1120 are used where the first, third and fifth columns (i.e. 1112, 1116, 1120) each have three COB units, including the corner COB units 1104, 1106, 1108, 1110, spaced apart evenly. Thus the first, third and fifth columns each have COB units on the same rows 1122, 1126, 1129. The second and forth columns (i.e. 1114, 1118) each have two COB units, each COB being located on an alternating row (i.e. rows 1124, 1128) from those on the first, third, and fifth columns 1112, 1116, 1120. Another way of looking at this arrangement is that the COB units form straight, regular lines when looking along a diagonal axis, from one corner to an opposing corner diagonally across the array 1100. This is equivalent to an array of regular rows and columns turned forty five degrees, as indicated in FIG. 12.

In addition to the columns and staggered rows of COB units, there are LED strips 1130, 1132, 1134, 1136, 1138, 1140, 1142, 1144 disposed around the periphery of the frame 1102, between the corner COB units 1104, 1106, 1108, 1110 and the center COB on each side. These LED strips provide light that has a different spectral output than the light produced by the COB units. The COB units and the LED strips are all driven by drivers 1146 (three drivers total, here).

Figure 12:
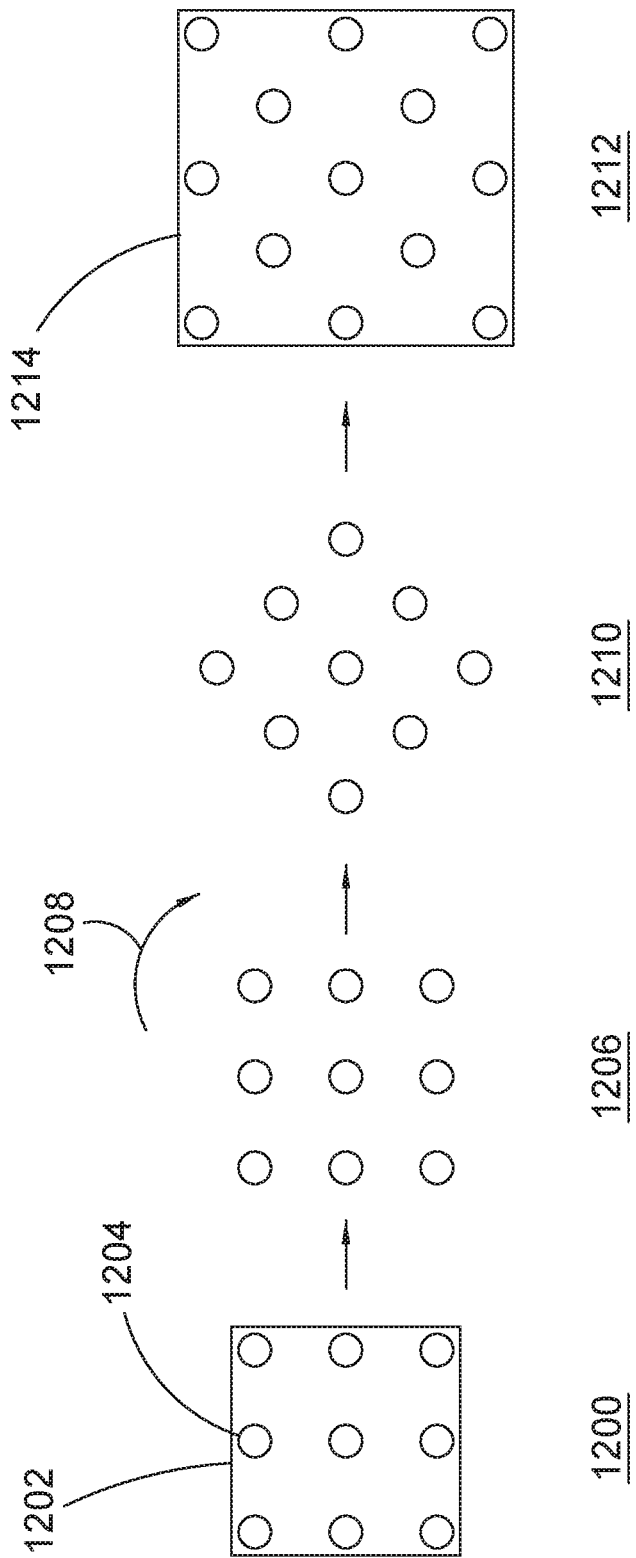
FIG. 12 shows a rotational transform for arranging COB elements in a lighting array, in accordance with some embodiments.

FIG. 12 shows a rotational transform for arranging COB elements in a lighting array, in accordance with some embodiments. Some arrays, such as those shown in FIGS. 5 and 11, use an arrangement that is substantially equivalent to that of a rotation of a regular matrix by forty five degrees. In state 1200 there is a shown a conventional square array 1202 that has a regular matrix of COB elements such as COB 1204. The regular matrix has regular columns and rows that conform to the sides of the array 1202. That is every column and every row have the same number of COB units. In this case, a 3×3 matrix is used as an example. In state 1206 the positions of the COB units in state 1200 is abstracted out of the array 1202, retaining the 3×3 format. However, as indicated by arrow 1208, the 3×3 matrix is rotated forty degrees to produce state 1210. In state 1212 the rotated 3×3 matrix COB position is shown in a new array 1214, with the addition of four COB units at the four corners of array 1214. As a result, there are, in array 1214, five columns and five rows that are staggered. The even columns do not have COB units on the same rows as those of the odd columns.

Figure 13:
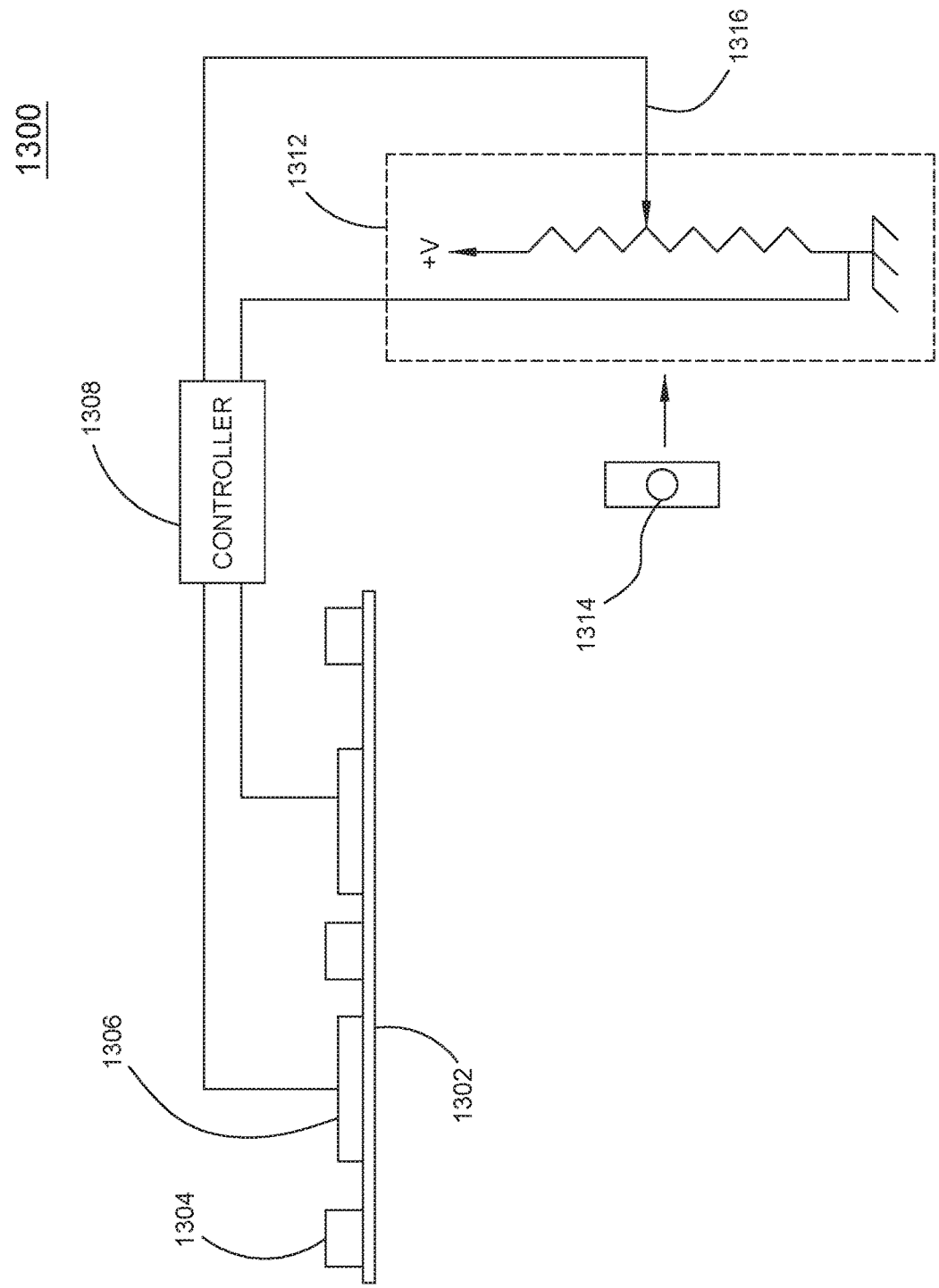
FIG. 13 shows a schematic diagram of a lighting system using a dimming control, in accordance with some embodiments.

FIG. 13 shows a schematic diagram of a lighting system 1300 using a dimming control, in accordance with some embodiments. One of the advantages of the inventive arrangements is that the uniformity of light across the growing area allows the light output to be reduced (dimmed), instead of adjusting the height of the lighting array over the plants. Typically the lighting array is kept 18" to 24" over the canopy. A lighting array 1302 is designed to have a plurality of COB units 1304 as shown, for example, in FIGS. 1-5, and 11, and includes drivers 1306 which are controlled by a controller 1308. The controller block is shown here separate from the array 1302 but can be a component mounted on the array 1302, or it can be integrated into the drivers 1306. The drivers have a variable output of current and voltage to the LED elements including the COB units 1304 and LED strips. The controller maps an input signal on line 1316 to an output level provided to the LED elements to adjust the light linearly. A dimmer 1312 can be used to provide the control signal on line 1316, and is a variable resistance to divide a known voltage level (+V) which is typically 10 volts. Thus, the output on line 1316 can be adjust between 0-10 volts. Typically the dimmer 1312 is provided in a potentiometer format with a knob 1314 that can be turned to adjust the resistance between the reference voltage and line 1316. Since the LED elements respond non-linearly with current, the controller 1308 is configured to map the input signal of 0-10 volts to a non-linear output of the drivers 1306 that results in a linear change of light output as the dimmer 1312 is adjusted. Thus, then the dimmer output on line 1316 is, for example, 10 volts (the maximum), the controller is configured to control the drivers to an maximum output level. This is not necessarily the maximum output capable of the drivers, but a selected maximum at which the LED elements will be driven. Likewise, when the output of the dimmer is zero, then the controller 1308 controls the drivers to output a minimum level of current to the LED elements, which is not necessarily the minimum output capable of the drivers 1306, but can be a selected minimum level corresponding to a minimum light output level desired by the designer of the system 1300. As the dimmer 1312 output is adjusted between the maximum (e.g. 10 volts) and its minimum output (e.g. 0 volts), the light output of the LED elements of the array 1302 varies linearly and in correspondence between a maximum light output and a minimum light output level.

Figure 14:
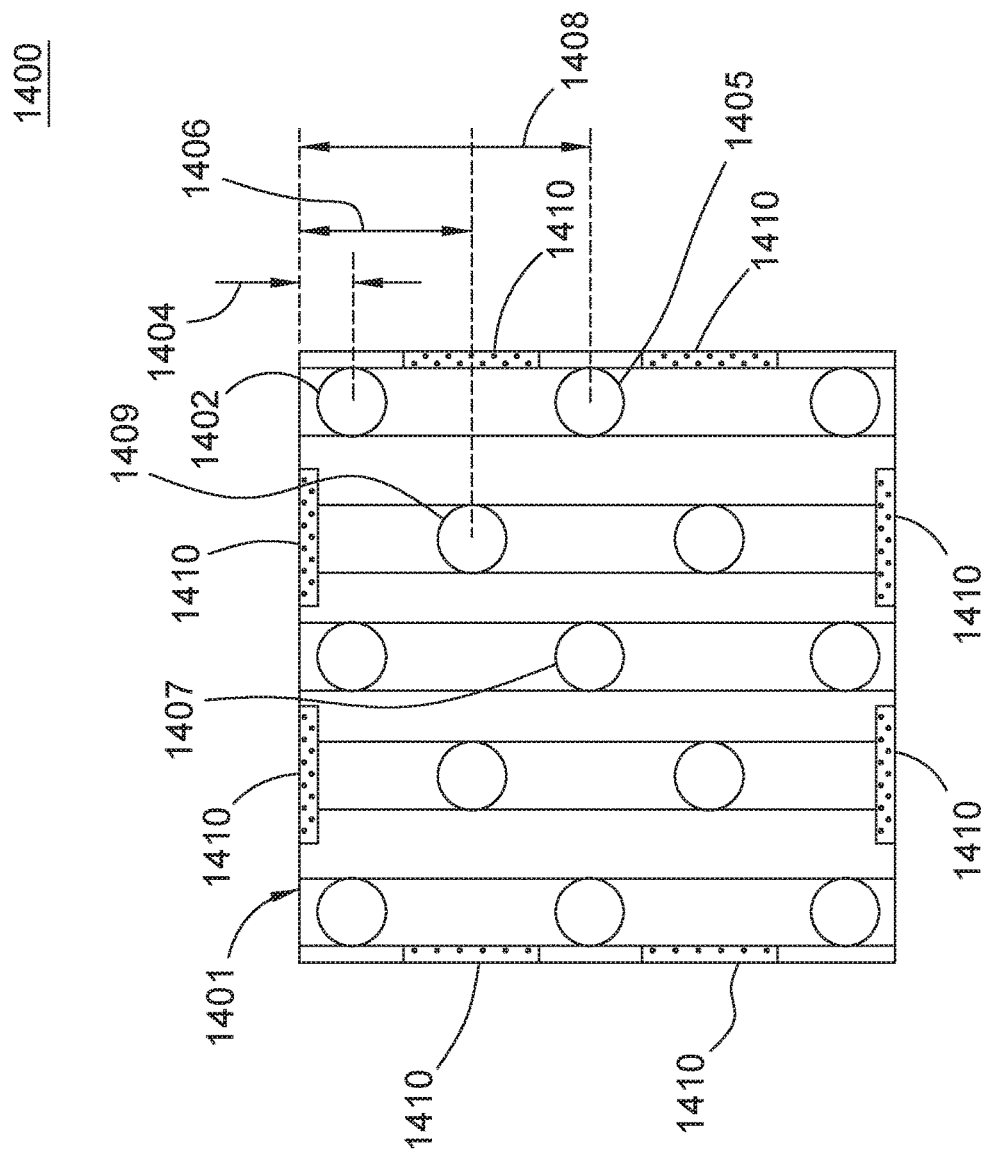
FIG. 14 indicates dimensional configurations for a lighting array, in accordance with some embodiments.

FIG. 14 indicates dimensional configurations for a lighting array 1400, in accordance with some embodiments. The lighting array 1400 is constructed using square rails to form the perimeter and support members of the frame 1401, with the support members spanning from a first side (the top, as drawn here) to an opposite second side (the bottom, as drawn here). The frame 1401 can be, for example, 42"×42". A plurality of COB units such as COB 1402 are mounted in the frame 1401 in an arrangement of an odd number of columns, with a COB unit in each corner. For example, the two outside columns and middle column each have three COB units. The second and fourth columns have COB units on different rows than that of the odd columns. The corner COB units can be, for example, made with Luminus CXM-22 Generation 3 COB units, installed to pin-finned heatsinks which provide passive heat dissipation. The center of the corner COB unit 1402 (and all corner COB units) can be located about 3.25" (distance 1404) in both directions (vertical and horizontal). Assuming a 42"×42" frame, then, distance 1408, from one side to the center of the middle COB 1405 is then about 21" from the top and bottom, and about 3.25" from the right side of the frame 1401. The center COB 1407 has a center that is 21" from all sides. The intermediate COB units, such as COB unit 1409, is located so that there centers are about 10.5" from the nearest sides, which is distance 1406.

An optimized LED lighting array for horticultural applications has been disclosed that overcomes the problems associated with the prior art, and provides the benefits of uniform photonic density over a grow area, and which is controllable in output intensity to ensure optimum light output as the plants grow closer to the LED array. The inventive LED lighting array utilizes a plurality of COB LED units placed in a staggered or hexagonal arrangement with respect to the frame. The arrangement of COB units includes one COB at each corner of the frame (which is rectangular or square). Additional COB units are placed in alternating columns that either duplicate the outside column defined by the corners, or which are in offset rows from those defined by the COB units in the outside columns.

What is claimed is:

1. A lighting array for horticultural usage, comprising:
a rectangular frame having four corners;
a plurality of chip on board (COB) light emitting diode (LED) units mounted in the frame, including one COB unit in each of the four corners which define outside columns and outside rows with respect to the frame, wherein the plurality of COB units are arranged into an odd number of columns, where alternating column between the outside columns arrange COB units in rows that are staggered between rows defined by the COB units in the outside columns; and
a plurality of LED strips disposed in the outside columns and the outside rows, between the COB units disposed in the outside columns and the outside rows.

2. The lighting array of claim 1, wherein the COB units between the outside columns define a hexagon.

3. The lighting array of claim 1, further comprising at least one driver configured to provide regulated electric power to the plurality of COB units and the plurality of LED strips.

4. The lighting array of claim 1, wherein the frame is comprised of metal rail members.

5. The lighting array of claim 1, wherein the plurality of COB units and the plurality of LED strips produce a peak to minimum photosynthetically active radiation (PAR) measurement of less than 400 with a peak PAR value of at least 700, over a four foot by four foot test area directly under the horticultural lighting array.

6. The lighting array of claim 1, wherein the COB units and the plurality of LED strips are configured to output a controllable light output level.

7. A horticultural lighting array for producing substantially uniform photonic density, comprising:
a plurality of rails arranged as a rectangular frame having four corners and defining a first side and a second side opposite the first side, a plurality of transverse rails arranged across the rectangular frame from the first side to the second side and parallel to each other and perpendicular to the first side and the second side;
a plurality of COB units disposed on the transverse rails, wherein the plurality of COB units include:
four corner COB units, with one corner COB unit in each of the four corners of the rectangular frame, wherein the four corner COB units define two columns on opposing sides of the frame, and which define rows across the frame perpendicular to the two columns; and
at least one additional COB unit located in a column between the two columns on opposing sides of the frame and located on a row between the rows defined by the four corner COB units.

8. The horticulture lighting array of claim 7, further comprising at least one LED strip on each of four sides of the rectangular frame at the periphery of the frame.

9. The horticulture lighting array of claim 7, wherein the at least one additional COB unit comprises a plurality of additional COB units, and wherein the plurality of additional COB units are arranged on the rectangular frame in a way that defines an odd number of columns, and further define at least three rows perpendicular to the odd number of columns and defining odd numbered columns and even numbered columns, and wherein the plurality of additional COB units are arranged such that COB units on the odd numbered columns do not share rows with COB units on the even numbered columns.

10. The horticulture lighting array of claim 7, wherein the plurality of COB units are arranged such that the photosynthetically active radiation (PAR) as measured on standardized PAR map at a standardized distance from the horticulture lighting array achieves a variance of less than 150 and produces a standard deviation of less than 200.

11. The horticulture lighting array of claim 7, further comprising:
at least one driver coupled to the plurality of COB units that provides an electric current output to the plurality of COB units;
a controller that provides a control signal to the driver, and wherein the driver provides the electric current output at a level corresponding to the control signal;
a dimmer coupled to a controller that provides an input to the controller, and wherein the controller varies the control signal to the driver with in correspondence with the input provided by the dimmer.

12. The horticulture lighting array of claim 7, wherein at least some of the plurality of COB units are arranged in the shape of a hexagon.

13. The horticulture lighting array of claim 7, wherein the plurality of rails are formed of square tubular metal sections.

14. The horticulture lighting array of claim 7, wherein the plurality of COB units and the plurality of LED strips produce a peak to minimum photosynthetically active radiation (PAR) measurement of less than 400 with a peak PAR value of at least 700, over a four foot by four foot test area directly under the horticultural lighting array.

15. The horticulture lighting array of claim 7, wherein the rectangular frame is a square frame having sides measuring substantially forty two inches, and wherein the plurality of COB units is thirteen COB units.

16. The horticulture lighting array of claim 7, wherein the rectangular frame is a square frame having sides measuring substantially twenty four inches, and wherein the plurality of COB units is five COB units.

17. The horticulture lighting array of claim 7, wherein the rectangular frame is a square frame having sides measuring substantially thirty six inches, and wherein the plurality of COB units is ten or eleven COB units.

* * * * *